(12) United States Patent
Nagai et al.

(10) Patent No.: US 8,748,737 B2
(45) Date of Patent: Jun. 10, 2014

(54) CONCENTRATOR PHOTOVOLTAIC DEVICE

(75) Inventors: Hirokazu Nagai, Nagoya (JP);
Tomokazu Nakatani, Nagoya (JP);
Daichi Tokuyasu, Nagoya (JP)

(73) Assignee: Daido Tokushuko Kabushiki Kaisha, Nagoya, Aichi (JP)

( * ) Notice: Subject to any disclaimer, the term of this patent is extended or adjusted under 35 U.S.C. 154(b) by 259 days.

(21) Appl. No.: 13/110,531

(22) Filed: May 18, 2011

(65) Prior Publication Data
US 2011/0284076 A1    Nov. 24, 2011

(30) Foreign Application Priority Data

May 21, 2010  (JP) ................................. 2010-117417

(51) Int. Cl.
*H01L 31/00*  (2006.01)
(52) U.S. Cl.
USPC ........................................................ 136/259
(58) Field of Classification Search
CPC ............................ H01L 31/0522; Y02E 10/52
USPC ................................................. 136/243–265
See application file for complete search history.

(56) References Cited

U.S. PATENT DOCUMENTS

| | | | |
|---|---|---|---|
| 6,350,945 B1* | 2/2002 | Mizuno ........................ | 136/246 |
| 2004/0244829 A1* | 12/2004 | Rearick et al. ................ | 136/251 |
| 2008/0072956 A1* | 3/2008 | Sharma et al. ................ | 136/256 |
| 2009/0159128 A1* | 6/2009 | Shook et al. .................. | 136/259 |
| 2010/0012171 A1* | 1/2010 | Ammar ......................... | 136/246 |
| 2010/0065120 A1* | 3/2010 | McDonald .................... | 136/259 |

FOREIGN PATENT DOCUMENTS

| | | |
|---|---|---|
| JP | 2006-313809 | 11/2006 |
| JP | 2007-201109 | 8/2007 |

OTHER PUBLICATIONS

English translation of Uozumi et al., Japanese Publication No. JP 2006-313809.*

* cited by examiner

*Primary Examiner* — Jeffrey T Barton
*Assistant Examiner* — Niki Bakhtiari
(74) *Attorney, Agent, or Firm* — Bacon & Thomas, PLLC

(57) ABSTRACT

A concentrator photovoltaic device includes: an optical concentrator; a solar battery cell; a homogenizer; a sealant; and a light transmission preventing layer. The homogenizer has a trapezoidal shape in which a sectional area at the optical concentrator side is larger than a sectional area at the solar battery cell side, a relationship of $n_h > n_f > n_t$ is satisfied among a refractive index $n_h$ of the homogenizer, a refractive index $n_f$ of the sealant, and a refractive index $n_t$ of the light transmission preventing layer, a thickness (H) of the light transmission preventing layer is equal to or larger than 0.1 mm and equal to or smaller than 1.2 mm, and a relationship of $0.5 \leq b/a < 1.0$ is satisfied between a height (b) of the light transmission preventing layer and a height (a) of the sealant at a position where the light transmission preventing layer is formed.

3 Claims, 3 Drawing Sheets

CONCENTRATOR PHOTOVOLTAIC DEVICE

CROSS REFERENCE TO RELATED APPLICATION

The present application claims priority from Japanese Patent Application No. 2010-117417, which was filed on May 21, 2010, the disclosure of which is herein incorporated by reference in its entirety.

TECHNICAL FIELD

The present invention relates to a concentrator photovoltaic device and more specifically, to a concentrator photovoltaic device which generates power by homogenizing high-energy sunlight concentrated by an optical concentrator (primary optical system) with a homogenizer (secondary optical system) and emitting the homogenized sunlight to a solar battery cell.

BACKGROUND

Solar power generators are categorized roughly into a non-concentrator photovoltaic device which emits sunlight to a solar battery cell as it is and a concentrator photovoltaic device which emits sunlight, which is concentrated by an optical concentrator, to a solar battery cell. In the case of the concentrator photovoltaic device, a solar battery cell can be made small. Accordingly, even if an expensive cell with good conversion efficiency is used, the effect on the cost of manufacturing electric power is slight. Therefore, the concentrator photovoltaic device is advantageous in that inexpensive electric power can be efficiently generated.

Light concentrated by the optical concentrator has a high intensity at its centre and a low intensity at its periphery. Even if such light is directly emitted to a solar battery cell, it is not possible to obtain high power generation efficiency. Therefore, in the concentrator photovoltaic device, a columnar or trapezoidal (tapered) optical member called a homogenizer is usually provided immediately above the solar battery cell. The homogenizer serves to homogenize light energy by repeatedly performing total reflection of high-energy sunlight, which is concentrated by the optical concentrator, on the side surface. Generally, glass with high light transmittance is used for the homogenizer. In particular, sodium containing glass, such as borosilicate glass and silicate glass, is used for the homogenizer since it is an all-purpose and cheap material and can be easily processed.

In addition, a solar battery cell is easily deteriorated by moisture. For example, group III-V compound semiconductor represented as InGaP/InGaAs/Ge is active compared with a crystalline silicon based semiconductor. Therefore, a solar battery cell using the group III-V compound semiconductor is noticeably deteriorated by moisture. In addition, an antireflection film is generally provided on the surface of a solar battery cell. However, the antireflection film may be altered if the antireflection film comes in contact with moisture. In addition, the sodium contained in the homogenizer may dissolve in condensed water and sodium ions may reach the solar battery cell through moisture. The sodium ions which reach the solar battery cell have accumulated a negative electric potential of the surface of the solar battery cell, resulting in a reduction of power generation efficiency. Therefore, in order to improve the durability of the concentrator photovoltaic device, it is necessary to protect the solar battery cell against moisture.

Various proposals have been made regarding a method of protecting such a solar battery cell from moisture.

For example, Patent Document 1 discloses a concentrating type solar power generating unit that uses a material containing 10% by weight or more of fluorinated silicon resin as a sealing resin (sealant) which covers the columnar optical member (homogenizer) and the solar battery cell facing the bottom surface.

Patent Document 1 also discloses the following points.

(a) If a material containing 10% by weight or more of fluorinated silicon resin is used as a sealing resin, permeation of vapor is suppressed due to the low vapor transmission property of the fluorinated silicon resin.

(b) A thin film, which is formed of fluororesin (refractive index: 1.34) with a thickness of about 10 nm to 20 nm and which functions as a protective member or a water repellent film, may be formed on the side surface of the homogenizer.

In addition, Patent Document 2 discloses a concentrator photovoltaic device in which transparent resin is provided between the bottom surface of the columnar optical member and the solar battery cell and which includes a light shielding member for blocking sunlight from the transparent resin.

Patent Document 2 also discloses the following points.

(a) Since photodegradation of the transparent resin is suppressed by the light shielding member, deterioration of the solar battery caused by the permeation of moisture is suppressed.

(b) A thin film, which is formed of fluororesin (refractive index: 1.34) with a thickness of about 10 nm to 20 nm and which functions as a protective member or a water repellent film, may be formed on the side surface of the homogenizer.

Since the sealing resin or the transparent resin for protecting a solar battery cell is exposed to the severe environment of the concentrator photovoltaic device, heat resistance and weather resistance are necessary. Materials containing silicon resin as a base material are currently used for these purposes. Generally, silicon resin has good weather resistance. However, since it is used in an area in contact with a severe environment, it is not possible to ensure sufficient weather resistance just through silicon resin. Therefore, a material obtained by adding a filler (for example, a glass compound) for increasing the weather resistance of silicon resin is generally used as the sealing resin.

The refractive index of silicon resin containing glass compound is about 1.5, which is close to the refractive index (about 1.6) of a homogenizer. If the periphery of a homogenizer is covered with sealant formed of a material with such a relatively high refractive index, the critical angle of the total reflection of light of the portion becomes larger than the critical angle of a portion which is not covered with the sealant.

On the other hand, when the shape of the homogenizer is a trapezoidal shape with a smaller sectional area at the solar battery cell side, the incidence angle of light (the angle between the normal line direction of the reflection surface and the light incidence direction) becomes small whenever reflection is repeated. Accordingly, if the lower side surface of the homogenizer is sealed with a high refractive index material, the probability that the incidence angle will become equal to or smaller than the critical angle (that is, the probability that light will leak) is higher near the lower side surface of the homogenizer.

In order to solve this problem, using a material with a relatively low refractive index as the sealant may be considered. However, there is no known material which has a low refractive index and is excellent in heat resistance and weather resistance.

RELATED ART DOCUMENT

Patent Document

[Patent Document 1] JP-A-2007-201109
[Patent Document 2] JP-A-2006-313809

SUMMARY

In order to solve the problem described above, it is an object of the present invention to provide a concentrator photovoltaic device with both high conversion efficiency and high weather resistance.

According to an aspect of the present invention, there is provided a concentrator photovoltaic device comprising: an optical concentrator for concentrating sunlight; a solar battery cell; a homogenizer which is provided above the solar battery cell such that a bottom surface thereof faces the solar battery cell and which guides sunlight concentrated by the optical concentrator to the solar battery cell; a sealant which covers a side surface of a lower portion of the homogenizer and the solar battery cell; and a light transmission preventing layer provided between the sealant and the homogenizer, wherein the homogenizer has a trapezoidal shape in which a sectional area at the optical concentrator side is larger than a sectional area at the solar battery cell side, a relationship of $n_h > n_f > n_t$ is satisfied among a refractive index $n_h$ of the homogenizer, a refractive index $n_f$ of the sealant, and a refractive index $n_t$ of the light transmission preventing layer, a thickness (H) of the light transmission preventing layer is equal to or larger than 0.1 mm and equal to or smaller than 1.2 mm, and a relationship of $0.5 \leq b/a < 1.0$ is satisfied between a height (b) of the light transmission preventing layer and a height (a) of the sealant at a position where the light transmission preventing layer is formed.

If a high refractive index material is used as the sealant which covers the lower side surface of a trapezoidal homogenizer and a solar battery cell, high weather resistance is obtained. In addition, if a light transmission preventing layer with predetermined refractive index $n_t$, thickness H, and height b is provided between the sealant and the homogenizer, leakage of light from the lower side surface of the homogenizer can be suppressed. As a result, conversion efficiency can be improved without reducing weather resistance.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE PRESENT INVENTION

Hereinafter, an embodiment of the present invention will be described in detail.

[1. Concentrator Photovoltaic Device]

Figure 1:
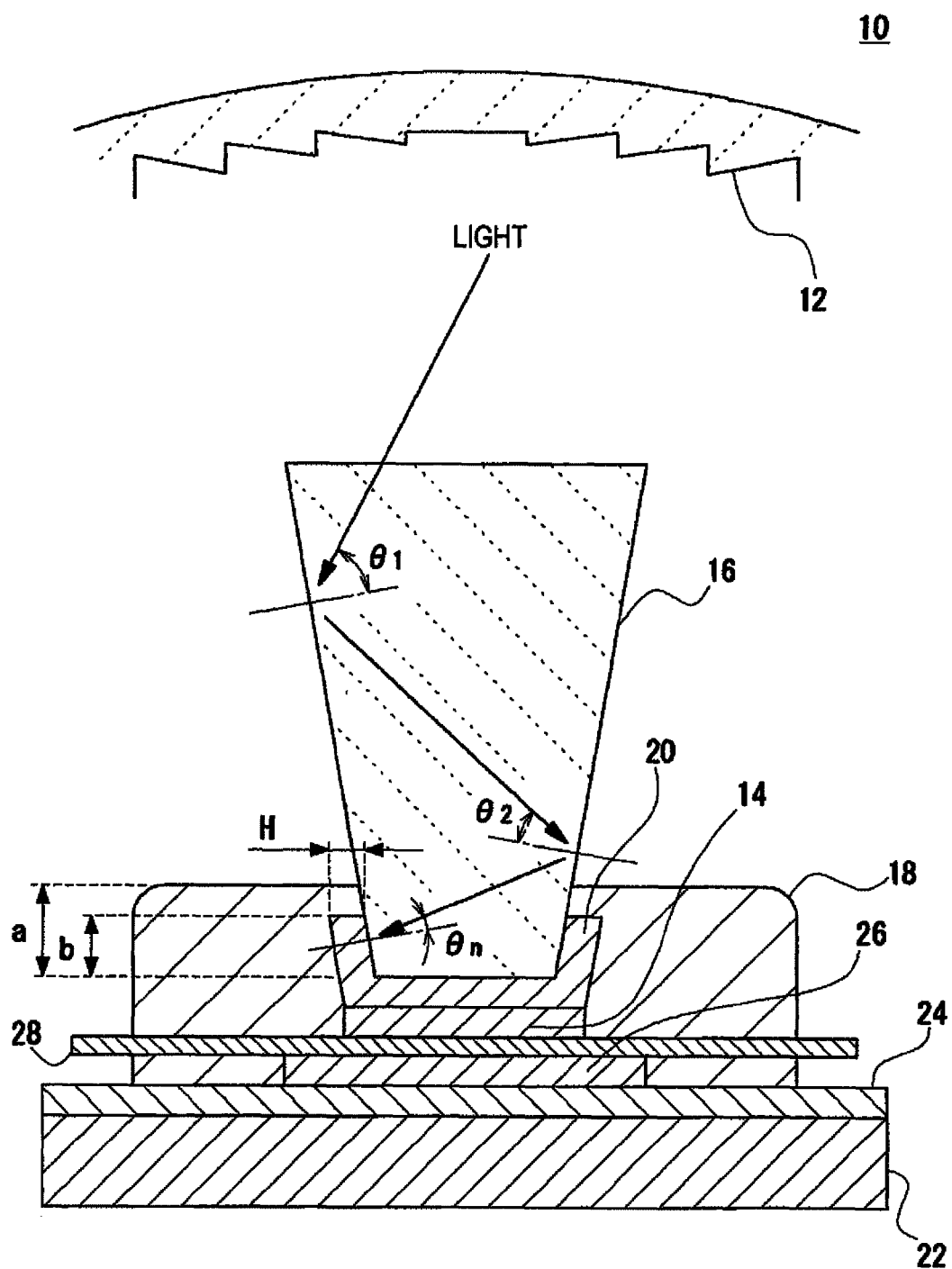
FIG. 1 is a schematic sectional view showing a concentrator photovoltaic device according to an embodiment of the present invention.

FIG. 1 is a schematic sectional view showing a concentrator photovoltaic device according to an embodiment of the present invention. In FIG. 1, a solar power generator 10 includes an optical concentrator 12, a solar battery cell 14, a homogenizer 16, sealant 18, and a light transmission preventing layer 20.

[1.1. Optical Concentrator]

The optical concentrator 12 is (the primary optical system) for concentrating sunlight and emitting the concentrated sunlight to the solar battery cell 14. A method using a concentrating lens, such as a Fresnel lens, and a method using a concentrating reflector, such as a concave mirror, are known as concentrating methods. In the present invention, any method may be used.

In the example shown in FIG. 1, the optical concentrator 12 is formed by a concentrating lens. The concentrating lens is advantageous in that it is secure against dust or dirt, excellent in durability, easy in heat radiation, and the like. The optical concentrator 12 is fixed above the solar battery cell 14 using a support means (not shown).

[1.2. Solar Battery Cell]

The solar battery cell 14 is a cell for converting emitted light into electric power. In the present invention, neither the structure of the solar battery cell 14 nor the material used to form it is particularly limited, and it is possible to use cells with various structures and materials.

Generally, a solar battery cell has a structure in which a bottom electrode, a semiconductor layer showing a photovoltaic effect, and an upper electrode are laminated in that order. An antireflection film may be formed on the surface of the semiconductor layer. As materials for the semiconductor layer, for example, crystalline silicon and group III-V compound semiconductor represented as InGaP/InGaAs/Ge are known.

A solar battery cell is generally fixed on a substrate, and various kinds of components required for power generation of the solar battery cell are provided on the substrate. In the example shown in FIG. 1, an insulation layer 24 and a plate 26 are formed on a substrate 22 in that order, and the solar battery cell 14 is fixed on the plate 26 with a lead electrode 28 interposed therebetween.

The substrate 22 serves to support the components, such as the solar battery cell 14. The material for the substrate 22 is not particularly limited, and various materials may be used. Examples of the material for the substrate 22 include aluminum, copper, and the like. The optical concentrator 12 is fixed to the substrate 22, or the substrate 22 is fixed to a fixed frame (not shown).

The insulation layer 24 serves to insulate one lead electrode 28, which is connected to a bottom electrode (not shown) of the solar battery cell 14, and the other lead electrode (not shown), which is connected to an upper electrode (not shown) of the solar battery cell 14. Various kinds of insulation materials may be used for the insulation layer 24. Examples of the material for the insulation layer 24 include (a) resin material in which glass fiber, alumina powder, and the like are distributed (b) ceramics with high heat conductivity, such as alumina.

The plate 26 serves to radiate the heat of the solar battery cell 14 and to reinforce the solar battery cell 14. The plate 26 is provided between the insulation layer 24 and the lead electrode 28. Various materials with high heat conductivity may be used for the plate 26. Examples of the material for the plate 26 include aluminum, copper, and the like.

[1.3. Homogenizer]

The homogenizer (secondary optical system) 16 serves to guide sunlight concentrated by the optical concentrator 12 to the solar battery cell 14. In addition, the homogenizer 16 serves to homogenize light energy by repeatedly performing total reflection of guided light on the side surface. The homogenizer 16 is erected right above the solar battery cell 14 such that the bottom surface faces the solar battery cell 14.

In the present invention, the homogenizer 16 has a trapezoidal shape in which the sectional area at the side of the optical concentrator 12 is larger than that at the side of the solar battery cell 14. The sectional shape of the homogenizer 16 is not particularly limited and may be any of the circular, elliptical, and polygonal shapes. The angle of the side surface of the homogenizer 16 (or the apex angle when the homogenizer 16 is assumed to be a cone) is not particularly limited, and various kinds of angles may be selected according to the purpose.

In the concentrator photovoltaic device 10, it is necessary to make the solar battery cell 14 turn exactly in the direction of the sun all the time in order to bend the sunlight with the optical concentrator 12. For this reason, the concentrator photovoltaic device 10 generally includes a tracking device for turning the solar battery cell 14 in the direction of the sun. However, when the shape of the homogenizer is a columnar shape, the conversion efficiency is significantly reduced if a tracking error occurs. On the other hand, when the homogenizer 16 is made to have a trapezoidal shape, there is an advantage in that conversion efficiency is not reduced even if a slight tracking error occurs.

A material with a high light transmittance is used for the homogenizer 16. Examples of the material of the homogenizer 16 include (a) sodium containing glass, such as borosilicate glass and silicate glass (b) aluminosilicate glass and sodium potassium barium glass. Especially, the sodium containing glass is suitable as a material of the homogenizer 16 because it is cheap and can be easily processed.

The refractive index $n_h$ of the homogenizer 16 needs to satisfy predetermined conditions. These will be described later.

Various kinds of films may be formed around the homogenizer 16 when necessary. For example, an antireflection film may be formed on the upper surface (light incidence surface) of the homogenizer 16. Examples of the antireflection film include (a) a $TiO_2/Al_2O_3$ antireflection film with a multilayered structure of alumina and titania, (b) an antireflection film including a magnesium fluoride layer or a calcium fluoride layer.

In addition, a protective film for preventing the permeation of moisture may be provided on the interface between the homogenizer 16 and the solar battery cell 14. In this case, the protective film may be formed of a material different from the light transmission preventing layer 20, which will be described later, or may be integrally formed on the lower side surface and bottom surface of the homogenizer 16 using the same material as the light transmission preventing layer 20 as shown in FIG. 1. In the case of forming the light transmission preventing layer 20 only on the lower side surface of the homogenizer 16, it is preferable to provide a protective film on the bottom surface of the homogenizer 16.

It is preferable to use a material, which is high in light transmission and heat resistance, for the protective film. In the case of forming a protective film separately from the light transmission preventing layer 20, examples of the material of the protective film include gel type silicon resin, an acrylic resin film, and the like.

[1.4. Sealant]

The sealant 18 is for covering the lower side surface of the homogenizer 16 and an exposed portion of the solar battery cell 14. Since the sealant 18 needs to prevent the permeation of moisture into the solar battery cell 14 for a long period of time, it is necessary to use a material with high heat resistance and weather resistance. Examples of the material of the sealant 18 include (a) silicon resin containing glass powder, (b) self-adhesive RTV rubber filled with white and opaque inorganic material powder which has high heat conductivity and high light reflectivity (for example, calcium carbonate, titanium oxide, high-purity alumina, high-purity magnesium oxide, beryllium oxide, and aluminum nitride), (c) material obtained by adding 10% by weight or more of fluorinated silicon resin to thematerial of (b), and (d) epoxy resin. The refractive index $n_f$ and the height a of the sealant 18 need to satisfy predetermined conditions. These will be described later.

[1.5. Light Transmission Preventing Layer]

The light transmission preventing layer 20 serves to prevent transmission of light from the lower side surface of the homogenizer 16 and is provided between the sealant 18 and the homogenizer 16. The light transmission preventing layer 20 may be formed only on the lower side surface of the homogenizer 16. Alternatively, as shown in FIG. 1, the light transmission preventing layer 20 may be integrally formed on the lower side surface and the bottom surface of the homogenizer 16. That is, the light transmission preventing layer 20 may also serve as the protective film described above.

When the light transmission preventing layer 20 also serves as a protective film, it is necessary to use a material which is high in heat resistance and excellent in light transmission. On the other hand, when the light transmission preventing layer 20 is formed only on the lower side surface of the homogenizer 16, the light transmission preventing layer 20 does not necessarily need to be formed of a light-transmissive material. Examples of the light transmission preventing layer 20 include silicon resin, fluororesin, and the like.

The refractive index $n_t$, height b, and thickness H of the light transmission preventing layer 20 need to satisfy predetermined conditions. These will be described later.

[1.6. Refractive Index]

The various above-described materials are known as materials which can prevent the permeation of moisture into the solar battery cell 14 and have heat resistance and/or weather resistance. There is a correlation between the weather resistance and the refractive index of the materials described above. In general, a material with high weather resistance tends to have a high refractive index. That is, a material which can be used as the sealant of the solar battery cell 14 while simultaneously satisfying the conditions of low refractive index and high weather resistance is not known.

Therefore, in the present invention, a high refractive index material with high weather resistance is used for the sealant 18 in order to prevent the permeation of moisture into the solar battery cell 14. On the other hand, the light transmission preventing layer 20 is provided between the homogenizer 16 and the sealant 18 in order to prevent the leakage of light from the lower side surface of the homogenizer 16, and a low refractive index material which has low weather resistance but has a low refractive index is used for the light transmission preventing layer 20.

That is, in the present invention, the relationship of $n_h > n_f > n_t$ is satisfied among the refractive index $n_h$ of the homogenizer 16, the refractive index $n_f$ of the sealant 18, and the refractive index $n_t$ of the light transmission preventing layer 20. This is a different point from a concentrator photovoltaic device in the related art.

A specific combination of the homogenizer 16, the sealant 18, and the light transmission preventing layer 20 is as follows For example, when the homogenizer 16 is sodium containing glass (refractive index: 1.6), it is preferable that (a) silicon resin containing glass powder (refractive index: 1.5), acrylic resin (refractive index: 1.5), polyester resin (refractive index: 1.5), and the like, are used as the sealant 18 and (b) silicon resin (refractive index: 1.3 to 1.39), fluororesin (refractive index: 1.3 to 1.4), and the like are used as the light transmission preventing layer 20.

[1.7. Thickness H]

The thickness H of the light transmission preventing layer 20 affects power generation efficiency and weather resistance. If the thickness H of the light transmission preventing layer 20 is too small, light easily leaks from the lower side surface of the homogenizer 16. In order to suppress the leakage of light, the thickness H of the light transmission preventing layer 20 needs to be equal to or larger than 0.1 mm. The thickness H of the light transmission preventing layer 20 is preferably 0.2 mm or more, more preferably 0.3 mm or more, and still more preferably 0.4 mm or more.

If the thickness H of the light transmission preventing layer 20 becomes large, the effect on power generation efficiency is eventually saturated. In addition, if the thickness H of the light transmission preventing layer 20 becomes too large, weather resistance is reduced. As a result, moisture easily reaches the solar battery cell 14. Therefore, the thickness H of the light transmission preventing layer 20 needs to be equal to or smaller than 1.2 mm. The thickness H of the light transmission preventing layer 20 is preferably 1.0 mm or less, and more preferably 0.8 mm or less.

[1.8. Height Ratio b/a]

The ratio(=b/a) between the height "b" of the light transmission preventing layer 20 and the height "a" of the sealant 18 at the position where the light transmission preventing layer 20 is formed has an effect on power generation efficiency and weather resistance. If the b/a ratio is too small, light easily leaks from the lower side surface of the homogenizer 16. Therefore, the b/a ratio needs to be equal to or larger than 0.5. The b/a ratio is preferably 0.8 or more, more preferably 0.7 or more, and still more preferably 0.6 or more.

On the other hand, if the b/a ratio is too large, weather resistance is reduced. In addition, the refractive index of the light transmission preventing layer 20 is larger than that of air. Accordingly, when the height "b" of the light transmission preventing layer 20 exceeds the height "a" of the sealant 18, the leakage of light from a portion covered only by the light transmission preventing layer 20 is increased. Moreover, since the light transmission preventing layer 20 is exposed to the atmosphere, the weather resistance is reduced. Therefore, the b/a ratio needs to be less than 1.0. The b/a ratio is preferably 0.98 or less, and more preferably 0.96 or less.

Here, the "height b of the light transmission preventing layer 20" refers to a distance from the bottom surface of the homogenizer 16 to the upper end of the light transmission preventing layer 20.

In addition, the "height a of the sealant 18" refers to a distance from the bottom surface of the homogenizer 16 to the upper end of the sealant 18. When the height a of the sealant 18 is not fixed, it is preferable that the conditions of the b/a ratio described above are satisfied at least at the position where the light transmission preventing layer 20 is formed.

[2. Method of Manufacturing the concentrator Photovoltaic Device]

When forming the light transmission preventing layer 20 on the lower side surface of the homogenizer 16, a material of the light transmission preventing layer 20 is first dissolved in an appropriate solvent to obtain a solution. Then, the solution is applied on the lower side surface of the homogenizer 16 (on the solar battery cell 14 side) using methods such as immersion and brushing. In this case, the solution may also be applied to the lower end surface of the homogenizer 16. By removing the solvent after coating, the light transmission preventing layer 20 can be formed at least on the lower side surface of the homogenizer 16. Then, the lower end surface of the homogenizer 16 is attached to the surface of the solar battery cell 14 fixed on the substrate 22, and the lower side surface of the homogenizer 16 and the solar battery cell 14 are sealed with the sealant 18.

For example, when the light transmission preventing layer 20 is silicon resin, the lower side of the homogenizer 16 is immersed in a solution of silicon resin for 1 to 5 seconds at room temperature. The homogenizer 16 is pulled up from the solution and attached to the solar battery cell 14 and is then cured (dried) at a temperature of 120 to 180° C. Through such a method, the light transmission preventing layer 20 which also serves as a protective film can be formed on the lower side surface and the bottom surface of the homogenizer 16.

Then, the concentrator photovoltaic device 10 according to the present invention is obtained by fixing the optical concentrator 12 to the substrate 22 or to the frame to which the substrate 22 is fixed.

[3. Operations of the Concentrator Photovoltaic Device]

In a state where the trapezoidal homogenizer 16 and the sealant 18 are directly bonded to each other, a part of light incident on the homogenizer 16 leaks outside from the interface between the homogenizer 16 and the sealant 18. This reduces the power generation efficiency of the solar battery cell 14.

This can be explained by the relationship between the refractive index $n_h$ of the homogenizer 16, and the refractive index $n_f$ of the sealant 18. That is, from Snell's law, the conditions of total reflection of light can be expressed as $\sin \theta = n_f/n_h$. Here, $\theta$ is an incidence angle of light (angle between the normal line direction of the reflection surface and the light incidence direction).

For example, when $n_h$ is 1.6, $\theta = 69.6°$ if $n_f$ is 1.5. Moreover, when $n_h$ is 1.6, $\theta = 54.3°$ if $n_f$ is 1.3. That is, the probability of total reflection of light within the homogenizer 16 becomes high, according to Snell's law, as the difference increases between the refractive index $n_h$ of the homogenizer 16 and the refractive index of a material (air or the sealant 18) in contact with the homogenizer 16, and the power generation efficiency is improved accordingly.

On the other hand, in order to suppress a reduction in the power generation efficiency caused by a tracking error in a tracking type solar power generator, it is necessary to make the homogenizer 16 have a trapezoidal shape in which the area of the light incidence surface is larger than the area of the surface facing the solar battery cell 14. When the shape of the homogenizer 16 is a trapezoid, the incidence angle $\theta$ of light becomes small as the total reflection of light within the homogenizer 16 is repeated. If the apex angle of a trapezoid when the homogenizer 16 is assumed to be a trapezoid is $\alpha$ and the incidence angles at the time of k-th and (k+1)-th reflection of light are $\theta_k$ and $\theta_{k+1}$, respectively, there is a relationship of $\theta_{k+1} = \theta_k - \alpha$ therebetween.

For this reason, if the lower side surface of the homogenizer 16 is sealed with the sealant 18 formed of a high refractive index material, the incidence angle $\theta_n$ of light near the sealant 18 becomes smaller than the critical angle of total reflection of light. In this case, light may leak to the side of the sealant 18. This reduces the amount of light reaching the solar battery cell 14, resulting in a decrease in the power generation efficiency. On the other hand, if a low refractive index material is used as the sealant 18 in order to avoid this, the weather resistance of the sealant 18 is reduced. As a result, the solar battery cell 14 deteriorates easily.

In contrast, if a high refractive index material is used as the sealant 18 which covers the lower side surface of the trapezoidal homogenizer 16 and the solar battery cell 14, weather resistance is improved. In addition, if the light transmission preventing layer 20 with the predetermined refractive index $n_t$, thickness H, and height b is provided between the sealant 18 and the homogenizer 16, the critical angle of total reflection of light near the sealant 18 becomes large and the probability that light will leak from the lower side surface of the homogenizer 16 is reduced accordingly. As a result, conversion efficiency can be improved without reducing weather resistance.

EXAMPLES

First Example and First Comparative Example

[1. Manufacturing of a Sample]

The concentrator photovoltaic device 10 with the structure shown in FIG. 1 was manufactured. Sodium containing glass whose refractive index $n_h$ was 1.6 was used for the homogenizer 16, and the size (mm) of the homogenizer 16 was set to □11×□7×L22. In other words, the homogenizer 16 has an upper square surface and a lower square surface, the length of each side of the upper square surface is 11 mm, the length of each side of the lower square surface is 7 mm, a length between the upper square surface and the lower square surface is 22 mm. Silicon resin containing glass powder whose refractive index $n_f$ of was 1.5 was used for the sealant 18. Silicon resin whose refractive index $n_t$ was 1.3 to 1.39 was used for the light transmission preventing layer 20. The thickness H of the light transmission preventing layer 20 was set to 0 mm (first comparative example) or 1.0 mm (first embodiment), and the ratio (b/a) between the height b of the light transmission preventing layer 20 and the height b of the sealant 18 was set to 0 (first comparative example) or 0.9 (first embodiment). The total number of solar battery cells 14 was set at 250.

[2. Test Method]
[2.1. Power Generation Efficiency]

Light of about 60 SUN was applied to the homogenizer 16, and a short-circuit current at that time was measured for every solar battery cell 14. A relative short-circuit current was calculated from the acquired short-circuit current.

The relative "short-circuit current" refers to a ratio(=$i/i_{m0}$) of a short-circuit current (i) of each solar battery cell to the average value ($i_{m0}$) of the short-circuit current in the first comparative example.

[2.2 Weather Resistance Test]

UV was emitted to the manufactured solar battery cell 14 using a UV emitting device. Energy of UV emission was set to 400 mW/cm$^2$, and the emission time was set to 20 minutes. The UV emission was stopped after the elapse of a predetermined time, and water was sprayed onto the solar battery cell 14 for 3 minutes. Subsequently, such an operation was repeated for 10 hours. After the end of the test, it was visually determined whether or not there was a crack or stickiness in the sealant around the homogenizer.

[3. Results]
[3.1. Power Generation Efficiency]

Figure 2:
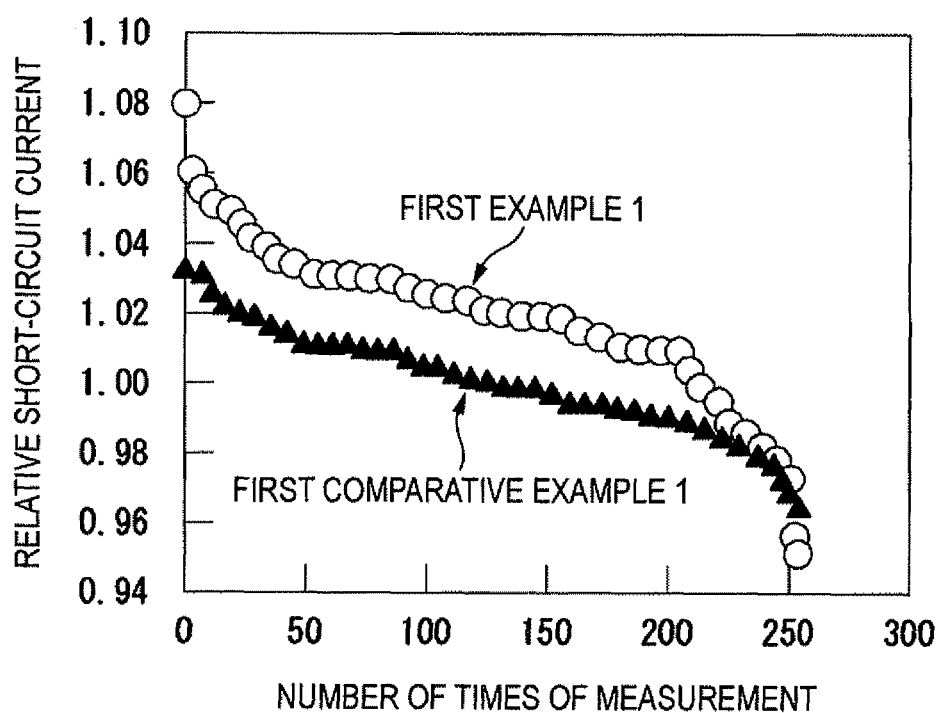
FIG. 2 is a view showing the relationship between the number of times of measurement of a solar battery cell and a relative short-circuit current.

FIG. 2 shows the relationship between the number of times of measurement of the solar battery cell 14 and a relative short-circuit current. The "number of times of measurement of the solar battery cell 14" indicates the rankings when a total of 250 solar battery cells are arrayed in order of high relative short-circuit current values. From FIG. 2, the following can be seen.

(1) The relative short-circuit current is different for each solar battery cell 14.

(2) In a range where the number of times of measurement (ranking) is 0 to about 200, the relative short-circuit current in the first example is higher by about 2.5% than that in the first comparative example.

Since the relative short-circuit current was correlated with the power generation efficiency, it could be seen that the power generation efficiency was improved when the light transmission preventing layer 20 was provided on the interface between the homogenizer 16 and the sealant 18.

[3.2 Weather Resistance]

Both the first embodiment and the first comparative example showed good weather resistance without a crack or stickiness in the sealant.

Second Example

[1. Manufacturing of a Sample]

The concentrator photovoltaic device 10 was manufactured in the same manner as in the first example except that the ratio b/a was set to 0.9 and the thickness H of the light transmission preventing layer 20 was changed in a range of 0 to 1.2 mm. The total number of solar battery cells 14 was 70 (7 levels×10).

[2. Test Method]
[2.1. Power Generation Efficiency]

Under the same conditions as in the first embodiment, a short-circuit current at that time was measured for every solar battery cell 14. The amount of relative increase in a short-circuit current was calculated from the acquired short-circuit current.

The "amount of relative increase in a short-circuit current (%)" refers to an increment(=$(i_{m2}-i_{m1})\times 100/i_{m1}$) of the average value ($i_{m2}$) of the short-circuit current of the solar battery cell 14 of each level to the average value ($i_{m1}$) of the short-circuit current of the solar battery cell 14 when b/a=0.9 and H=0.0 mm.

[2.2 Weather Resistance]

Weather resistance was evaluated under the same conditions as in the first example.

[3. Results]
[3.1. Power Generation Efficiency]

Figure 3:
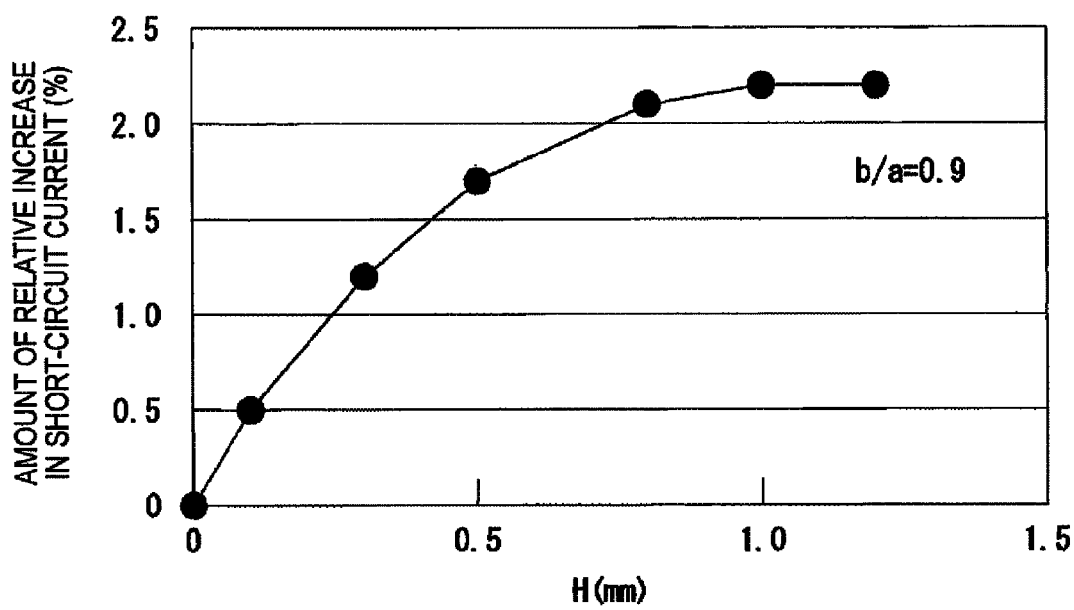
FIG. 3 is a view showing the relationship between the thickness H of a light transmission preventing layer and the amount of relative increase in a short-circuit current.

FIG. 3 shows the relationship between the thickness H of the light transmission preventing layer 20 and the amount of relative increase in a short-circuit current when b/a=0.9.

From FIG. 3, the following can be seen.

(1) When H becomes 0.1 mm or more, the amount of relative increase in a short-circuit current becomes 0.5% or more.

(2) When H becomes 0.1 mm or more, the amount of relative increase in a short-circuit current is almost saturated.

(3) In order to obtain the amount of relative increase in a short-circuit current which is equal to or larger than 1.0%, H needs to be equal to or larger than 0.25 mm.

(4) In order to obtain the amount of relative increase in a short-circuit current which is equal to or larger than 1.5%, H needs to be equal to or larger than 0.42 mm.

(5) In order to obtain the amount of relative increase in a short-circuit current which is equal to or larger than 2.0%, H needs to be equal to or larger than 0.73 mm.

[3.2 Weather Resistance]

All of the solar battery cells showed good weather resistance without a crack or stickiness in the sealant.

(Third Embodiment)

[1. Manufacturing of a Sample]

The concentrator photovoltaic device 10 was manufactured in the same manner as in the first example except that the thickness H was set to 1.0 mm and the ratio b/a of the light transmission preventing layer 20 was changed in a range of 0.1 to 1.2. The total number of solar battery cells 14 was 120 (12 levels×10).

[2. Test Method]

[2.1. Power Generation Efficiency]

Under the same conditions as in the first embodiment, a short-circuit current at that time was measured for every solar battery cell 14. The amount of relative increase in a short-circuit current was calculated from the acquired short-circuit current.

The "amount of relative increase in a short-circuit current (%)" refers to an increment($=(i_{m4}-i_{m3})\times 100/i_{m3}$) of the average value ($i_{m4}$) of the short-circuit current of the solar battery cell 14 of each level to the average value ($i_{m3}$) of the short-circuit current of the solar battery cell 14 when b/a=0.9 and H=1.0 mm.

[2.2 Weather Resistance]

Weather resistance was evaluated under the same conditions as in the first embodiment.

[3. Results]

[3.1. Power Generation Efficiency]

Figure 4:
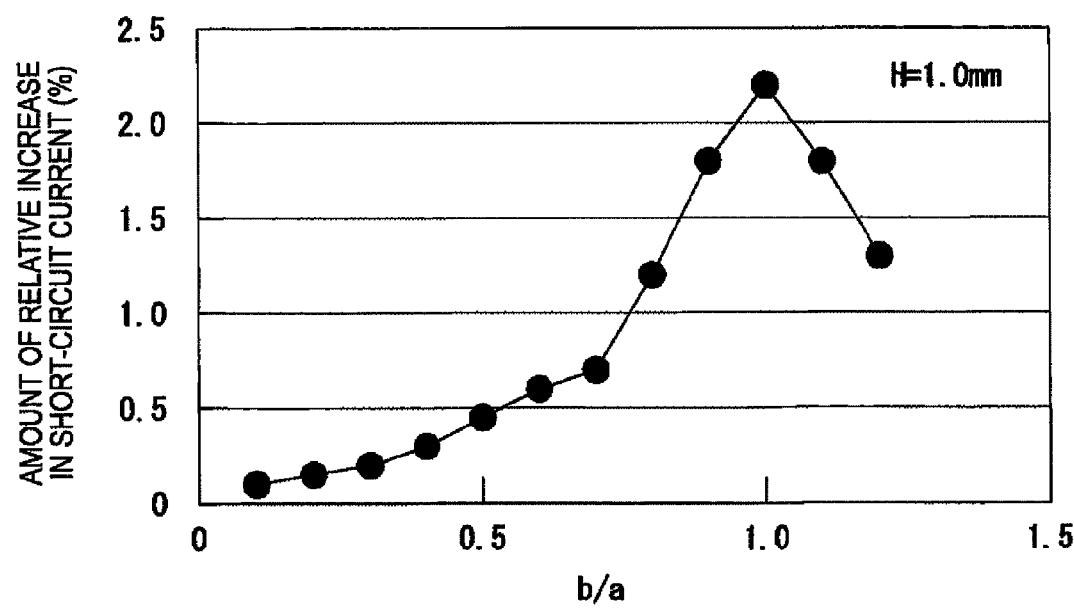
FIG. 4 is a view showing the relationship between the ratio b/a of the height "b" of the light transmission preventing layer to the height "a" of the sealant and the amount of relative increase in a short-circuit current.

FIG. 4 shows the relationship between the ratio b/a of the light transmission preventing layer 20 and the amount of relative increase in a short-circuit current when H=1.0 mm.

From FIG. 4, the following can be seen.

(1) When the ratio b/a becomes 0.5 or more, the amount of relative increase in a short-circuit current becomes 0.45% or more.

(2) The amount of relative increase in a short-circuit current becomes a maximum when the ratio b/a is 1.

(3) When the ratio b/a exceeds 1, the amount of relative increase in a short-circuit current is reduced because a contact portion between the homogenizer 16 and the air is reduced.

(4) In order to obtain the amount of relative increase in a short-circuit current which is equal to or larger than 1.0%, the ratio b/a needs to be equal to or larger than 0.75.

(5) In order to obtain the amount of relative increase in a short-circuit current which is equal to or larger than 1.5%, the ratio b/a needs to be equal to or larger than 0.85 and equal to or smaller than 1.16.

(6) In order to obtain the amount of relative increase in a short-circuit current which is equal to or larger than 2.0%, the ratio b/a needs to be equal to or larger than 0.95 and equal to or smaller than 1.05.

[3.2 Weather Resistance]

When the ratio b/a was equal to or larger than 1, a crack or stickiness was found in the sealant. In contrast, when the ratio b/a was less than 1, neither a crack nor stickiness was found.

While the embodiments of the present invention have been described in detail, the present invention is not limited to any of the above embodiments, and various modifications can be made without departing from the scope and spirit of the present invention.

INDUSTRIAL APPLICABILITY

The concentrator photovoltaic device according to the present invention can be used as a power generator for supplying electric power to factories or homes.

What is claimed is:

1. A concentrator photovoltaic device comprising:
an optical concentrator for concentrating sunlight;
a solar battery cell;
a homogenizer which is provided above the solar battery cell such that a bottom surface thereof faces the solar battery cell and which guides sunlight concentrated by the optical concentrator to the solar battery cell;
a sealant which covers a side surface of a lower portion of the homogenizer and the solar battery cell; and
a light transmission preventing layer provided between the sealant and the homogenizer and integrally formed on a lower side surface and a bottom surface of the homogenizer,
wherein the homogenizer has a trapezoidal shape in which a sectional area at the optical concentrator side is larger than a sectional area at the solar battery cell side,
a relationship of $n_h > n_f > n_t$ is satisfied among a refractive index $n_h$ of the homogenizer, a refractive index $n_f$ of the sealant, and a refractive index $n_t$ of the light transmission preventing layer,
a thickness (H) of the light transmission preventing layer is equal to or larger than 0.1 mm and equal to or smaller than 1.2 mm, and
a relationship of $0.5 \leq b/a < 1.0$ is satisfied between a height (b) of the light transmission preventing layer which is defined as the distance between a bottom edge of the homogenizer and a top most edge of the light transmission preventing layer and a height (a) of the sealant which is defined as the distance between the bottom edge of the homogenizer and a top most edge of the sealant.

2. The concentrator photovoltaic device according to claim 1, wherein the thickness (H) of the light transmission preventing layer is equal to or larger than 0.2 mm and equal to or smaller than 1.0 mm.

3. The concentrator photovoltaic device according to claim 1, wherein a relationship of $0.6 \leq b/a \leq 0.98$ is satisfied between the height (b) of the light transmission preventing layer and the height (a) of the sealant at the position where the light transmission preventing layer is formed.

* * * * *